United States Patent [19]

Mori et al.

[11] Patent Number: 5,262,339
[45] Date of Patent: Nov. 16, 1993

[54] METHOD OF MANUFACTURING A POWER SEMICONDUCTOR DEVICE USING IMPLANTS AND SOLID DIFFUSION SOURCE

[75] Inventors: Mutsuhiro Mori; Yasumichi Yasuda; Yasunori Nakano, all of Hitachi, Japan

[73] Assignee: Hitachi, Ltd., Tokyo, Japan

[21] Appl. No.: 17,420

[22] Filed: Feb. 10, 1993

Related U.S. Application Data

[60] Division of Ser. No. 762,793, Sep. 19, 1991, Pat. No. 5,208,471, which is a continuation of Ser. No. 536,521, Jun. 12, 1990, abandoned.

Foreign Application Priority Data

Jun. 12, 1989 [JP] Japan ................... 1-146814
Sep. 20, 1989 [JP] Japan ................... 1-242224

[51] Int. Cl.$^5$ .................................. H01L 21/266
[52] U.S. Cl. .......................... 437/41; 437/148; 437/164; 148/DIG. 126
[58] Field of Search ............... 437/28, 30, 41, 44, 437/148, 149, 150, 153, 154, 164, 162; 148/DIG. 126

[56] References Cited

U.S. PATENT DOCUMENTS

| | | | |
|---|---|---|---|
| 4,691,435 | 9/1987 | Anantha et al | 437/162 |
| 4,705,759 | 11/1987 | Lidow et al. | 437/150 |
| 4,717,679 | 1/1988 | Baliga et al. | 437/148 |
| 4,757,032 | 7/1988 | Contiero | 437/150 |
| 4,837,179 | 6/1989 | Foster et al. | 437/164 |
| 4,996,168 | 2/1991 | Ozaki et al. | 437/164 |
| 5,032,532 | 7/1991 | Mori et al. | 437/41 |

FOREIGN PATENT DOCUMENTS 0229977 10/1987 Japan .................. 437/41

*Primary Examiner*—Tom Thomas
*Assistant Examiner*—C. Chaudhari
*Attorney, Agent, or Firm*—Antonelli, Terry, Stout & Kraus

[57] ABSTRACT

A semiconductor device comprises a semiconductor substrate, a semiconductor layer of a first conductivity type formed on said semiconductor substrate, a first semiconductor well region of a second conductivity type and second semiconductor well regions of the second conductivity type, the latter two types of regions being formed in said semiconductor layer. The first semiconductor well region is located at the peripheral area of the semiconductor, and the well is deeper than the well of the second semiconductor well regions. Third semiconductor well regions of the first conductivity type are formed in the second semiconductor well regions. Gate electrodes and an emitter (source) electrode are formed at specified positions on the upper surface of the semiconductor device, and a collector (drain) electrode is formed on the bottom surface.

1 Claim, 8 Drawing Sheets

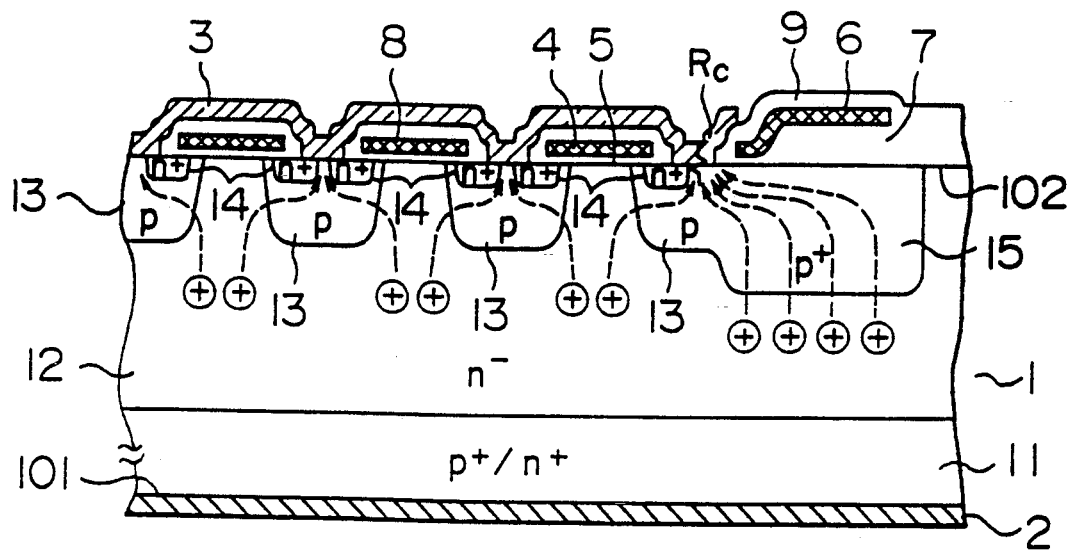
FIG. IA
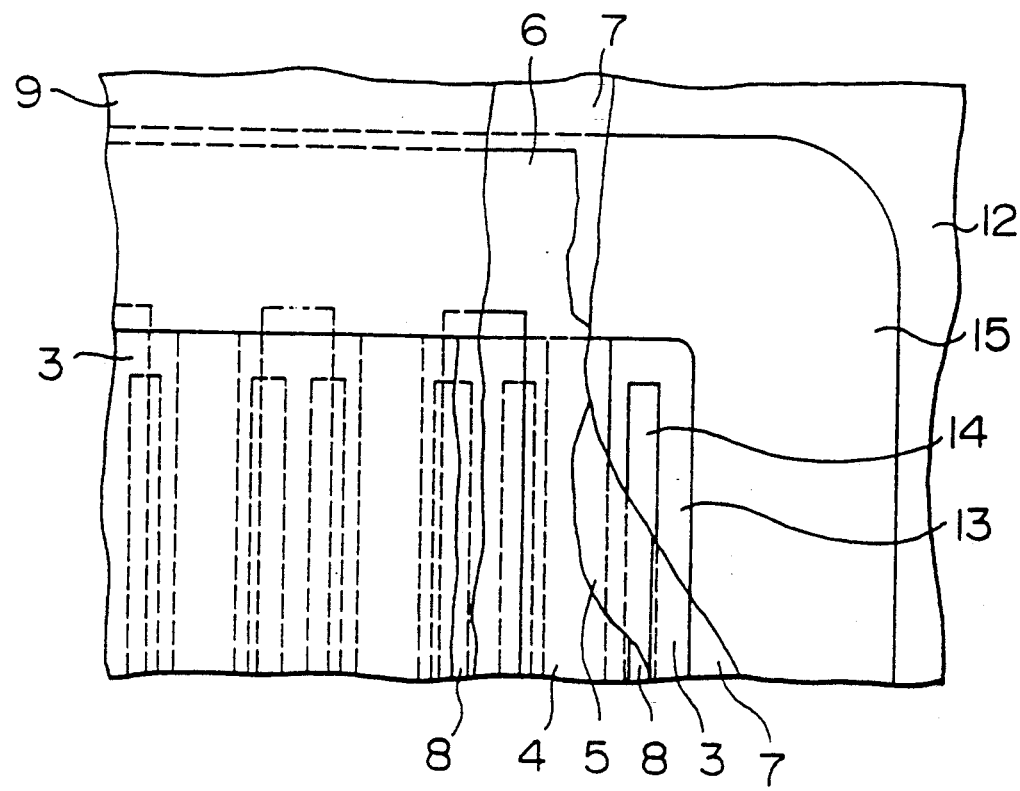
FIG. IB

TURN-OFF WAVEFORMS

METHOD OF MANUFACTURING A POWER SEMICONDUCTOR DEVICE USING IMPLANTS AND SOLID DIFFUSION SOURCE

This is a divisional of application Ser. No. 762,793, filed Sep. 19, 1991; which is a continuation of application Ser. No. 536,521, filed Jun. 12, 1990, now abandoned.

BACKGROUND OF THE INVENTION

The present invention relates to a semiconductor device having an insulated gate, and particularly to a semiconductor device having a structure for high-speed operation and excellent breakdown strength.

Recently, power MOSFETs (Metal-Oxide-Semiconductor Field Effect Transistors) and IGBTs (Insulated Gate Bipolar Transistors) have come to be used in large quantities as power switching devices with high breakdown strength, which can operate at high frequencies. For example, such power switching devices are disclosed in U.S. Pat. No. 4,532,534 and Fuji Jiho, Vol. 61, No. 11, pp. 697-700. FIG. 5 shows a schematic diagram, as viewed from the surface, newly drawn for explaining these devices conceptually. In a power MOSFET or IGBT 1, first insulated gate electrodes 4 are formed in stripes on a semiconductor substrate 1, and these first insulated gate electrodes 4 are electrically connected to a second insulated gate electrode 6 surrounding the first insulated gate electrodes 4. Reference numeral 10 indicates an electrode wire supplying control power to the insulated gate electrodes 4, 6.

FIG. 6 shows a cross-sectional structure taken along the line VI—VI of FIG. 5.

In FIG. 6, the semiconductor substrate 1 has a couple of main surfaces 101, 102, and has a n+ or p+ substrate region 11 of high impurity concentration formed adjacent one main surface 101, an n− layer 12 of low impurity concentration formed adjacent the substrate region 11, and a plurality of p-type layers 113 of higher impurity concentration than that of the n− layer 12 formed geometrically separated from one another in the n− layer 12. In each p-type layer 113, there are formed separately two n+ layers 114 of higher impurity concentration than that of the p-type layer 113. In a unit cell region of the semiconductor device, the p-type layer 113 is contiguous to a p+ layer 115 which has a well deeper than that of the p-type layer 113. At the other main surface 102, an n− layer 12, the p-type layers 113, and the n+ layers 114 are exposed. A collector electrode 2 is in ohmic contact with the surface of the substrate region 11, while at the other main surface 102, an emitter electrode 3 is in ohmic contact with two n+ layers 114, the p-type layers 113 located between the two n+ layers 114, and p+ layers 115. First insulated gate electrodes 4 are formed, with interposition of an insulating film 5, such that they extend from above the n− layer 12, over and beyond the p-type layers 113, to the n+ layers 114. In the peripheral area of the semiconductor device, the p-type layer 113 is contiguous to the p+ layer 115 located closer to the periphery and having a well deeper than that of the p+ layer 115. A second insulated gate electrode 6 is formed on the p+ layer with interposition of a thick insulating film 7. The emitter electrode 3 is insulated from the first and second gate electrodes 4, 6 by an insulating film 8.

As described above, a power MOSFET or an IGBT is divided into the region Ⓐ where a unit cell centering around the first insulated gate electrode 4 is formed repeatedly and the peripheral region Ⓑ other than the region Ⓐ.

To turn on such a semiconductor device, the collector electrode 2 is put at a positive potential relative to the emitter electrode 3, and the first and second insulated gate electrodes 4, 6 are put at potential positive relative to the emitter electrode 3. Under this condition, the surfaces of the p-type layers 113 contiguous to the insulating film 5 is inverted into n-type, and electrons flow through the emitter electrode 3 to the n+ layers, the n-type inverted layers, and the n− layer 12, and into the p+ substrate region 11. As a result, the injection of holes ⊕ having positive charges from the p+ substrate region is promoted, and the holes flow through the n− layer 12 and the p-type layers 113 into the emitter electrode 3. By the flows of the electrons and holes, an electric current flows from the collector 2 into the emitter electrode 3. To switch the semiconductor device from the ON state to the OFF state, it is only necessary to remove the potentials from the first and second insulated gate electrodes 4, 6. Then, the n-type inverted layer will disappear, and the electron current is cut off, with the result that the injection of holes stops and the current stops flowing.

For the IGBT, the substrate region 11 is of p+ type, and therefore, an IGBT is formed in a four-layer structure comprising a p+ substrate 11, n− layer 12, p-type layer 113, and n+ layer 114. Therefore, the IGBT has a parasitic thyristor formed therein. Once the parasitic thyristor has started to operate, it becomes impossible to control their operation with the first and second insulated gates 4, 6, leaving the current to multiply, resulting in the device being destroyed by Joule heat. This is referred to as a latchup. This latchup can occur not only in the region Ⓐ but also in the region Ⓑ. In some device structures, the region Ⓑ is more susceptible to a latchup, and the breakdown strength of the IGBT is determined by the region Ⓑ. FIG. 6 shows a device structure in which preventive measures have been employed. Specifically, by having the p-type layer 113 and the p+ layer 115 contiguous to each other, the electron current is prevented from flowing through the n+ layer 114 located in the region Ⓑ. In other words, the peripheral p+ layer 115 is given a higher carrier concentration than the p-type layer 113 so that the peripheral p+ layer 115 is less liable to be inverted to n-type under the second insulating gate 6. At the same time, the insulating film 7 is made thick. In consequence, the quantity of holes ⊕ present in the region Ⓑ is made smaller than in the region Ⓐ, and a voltage drop in the p-type layer 113 and the peripheral p+ layer 115 which is caused by the resistance Rp below the n+ layer 114 and the hole current is made lower than the diffusion potential (about 0.7 V at room temperature) of the p-type layer 113, the peripheral p+ layer 115, and the n+ layer 114, making it impossible for a latchup to occur in the ordinary ON state. In addition, since the peripheral p+ layer 115 is short-circuited to the emitter electrode 3 at the boundary between the regions Ⓐ and Ⓑ, a small amount of holes is collected quickly in turning off the device, thus reducing the turn-off time.

On the other hand, a device of this structure in which the substrate region 11 is an n+ layer is a power MOSFET. To turn on the power MOSFET, like in the IGBT, while the collector electrode (drain electrode) 2 is placed at a positive potential, a positive potential is applied to the first and second insulated gate electrodes 4, 6. Thus, an inverted layer is produced in that part of the p-type layer just below the surface of the insulating layer 5, electrons flow through the n+ layers 114, the inverted layers, the n− layer 12 to the n+ substrate region 11, and as a result, an electric current flows from the drain electrode 2 to the emitter electrode (source electrode) 3. To turn off this power MOSFET, it is only necessary to remove the potential from the insulated gate electrodes. Then, the inverted layers disappear, so that the current is cut off. In the meantime, the power MOSFET includes p-n diodes each comprising an n+ substrate region 11, an n− layer 12, and a p-type layer 113 (peripheral p+ layer 115). Some attempts have been made in the application of this p-n diode as a feedback diode. For example, when a potential is applied to the source electrode 3 of the power MOSFET, which is positive with regard to the drain electrode 2, a current is supplied in the forward direction by using this diode. In this process, holes ⊕ are injected into the n− layer 12 from the p-type layer 113 and the p+ layer 115. Next, the moment the source electrode becomes negative with respect to the potential at the drain electrode 2, the holes ⊕ are attracted to the source electrode 3. In this case, if the peripheral p+ layer 115 is short-circuited to the source electrode 3 in the vicinity of the peripheral p+ layer 115, the peripheral p+ layer to serve as a resistance when the holes are attracted to the source electrode 3 is reduced in length, permitting the diode to recover at high speed. At this time, the current of holes ⊕ flow through the p-type layer 113 (peripheral p+ layer 115) beneath the n+ layer 114 located closest to the peripheral region (B).

In the device of FIG. 6, the IGBT or the power MOSFET is not so constructed as to securely prevent the parasitic thyristor or the parasitic transistor from operating when the device is switched from the ON state to the OFF state at high speed, and therefore is liable to be destroyed. More specifically, the p-n junction is forward-biased by the resistance Rp of the p-type layer 113 (peripheral p+ layer 115) beneath the n+ layer 114 closest to the peripheral region (B), and by the current of injected holes ⊕ and the discharge current of the p-n junction. As a result, the parasitic thyristor (parasitic transistor) comprising the p+ substrate (n+ substrate) 11, the n− layer 12, the p-type layer 113, and the n+ layer 114 is put into operation, which has been a problem.

Furthermore, in the device of FIG. 6, the p-type layers formed in the n− layer 12 on both the regions (A) and (B) have the same depth. Therefore, due to a transient voltage which occurs in the transient state causing avalanching to take place in the whole area including the region (A), and the device becomes uncontrollable by the operation of the parasitic thyristor (parasitic transistor).

The present invention has been made with a view to providing an IGBT or a power MOSFET constructed such that a parasitic thyristor or a parasitic transistor does not operate while the switching function, particularly the high-speed turn-off function, is maintained.

SUMMARY OF THE INVENTION

An object of the present invention is to realize a semiconductor device which can perform high-speed switching, particularly a high-speed turn-off action, and which has a high insulation capacity (high voltage blocking capacity), and also to realize a manufacturing method therefor.

Another object of the present invention is to realize a semiconductor device capable of preventing a latchup phenomenon which is caused by a parasitic thyristor or a parasitic transistor and also a manufacturing method therefor.

Still another object of the present invention is to realize a semiconductor device having a large current capacity and also a manufacturing method therefor.

A semiconductor device according to the present invention comprises a p-type or n-type semiconductor substrate, an n− layer formed on said substrate, and a plurality of p-type layers formed in a well form in said n− layer. In each of the above-mentioned p-type layers, at least one n+ layer is formed. Insulated gate electrodes are formed to face the regions in the n+ layer where the p-type layers are not formed. An emitter electrode (source electrode) is so formed as to be contiguous to the p-type layers and the n+ layers. A collector electrode (drain electrode) is formed on the bottom surface of the semiconductor device.

It is also possible to form a material containing n-type impurities, that is, PSG (phosphosilicate glass) for example, and form n+ layers by diffusing the element phosphorus in this PSG into the silicon crystal. In the peripheral region where n+ layers need not be formed, if part of the insulating film (oxide film) is left on the surface of the semiconductor and PSG is formed on the above-mentioned insulating film, the diffusion of the element phosphorus into the silicon region is inhibited, so that no n+ layer is formed.

The material containing n-type impurities (PSG, for example) contributes to an improvement of the breakdown strength between the electrodes. By this method, it is possible to form p-type layers, n+ layers, and PSG side walls along the sides of the gate electrodes with self alignment.

By using the manufacturing method of a semiconductor device according to the present invention, the microminiaturization of unit cells of a semi-conductor device can be realized. As the structure of the unit cells of a semiconductor is miniaturized, the current density per unit area and the current capacity of the semiconductor device can be increased.

DESCRIPTION OF THE DRAWINGS

FIG. 1A is a cross-sectional view of an embodiment of the semiconductor device according to the present invention;

FIG. 1B is a plan view of the semiconductor device of FIG. 1A;

DESCRIPTION OF THE PREFERRED EMBODIMENTS

Figure 1C:
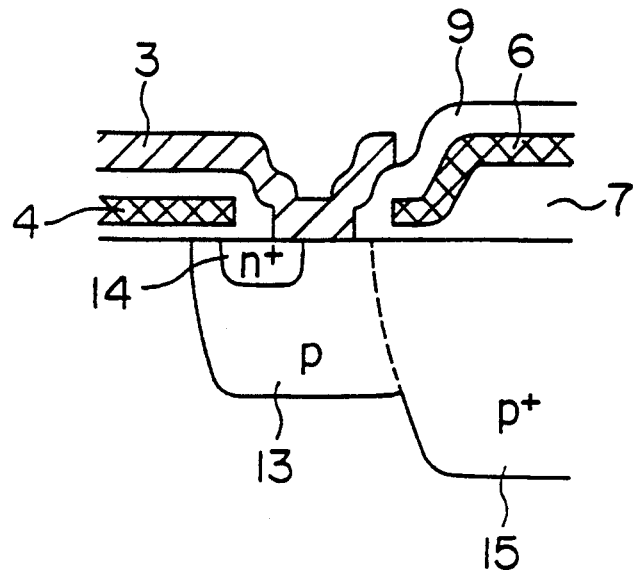
FIGS. 1C to 1E show embodiments relating to the construction of the peripheral area of the semiconductor device of FIG. 1A.

The present invention will be described with reference to the accompanying drawings showing preferred embodiments.

FIG. 1 shows an embodiment of the semiconductor device according to the present invention. A semiconductor device 1 has a couple of main surfaces 101, 102. Between the main surfaces 101, 102, the semiconductor device 1 has the regions as follows: a p+ or n+ substrate region 11 located contiguous to one main surface 101; an n− layer having a lower impurity concentration than the substrate region 11 and located contiguous to the other main surface 102; a plurality of p-type layers 13 of a higher impurity concentration than that of the n− layer, wherein those parts exposed at the other main surface 102 are long and narrow and juxtaposed with their longitudinal direction oriented in the same direction; n+ layers 14 having a higher impurity concentration than the p-type layers 13 and extending from the other main surface 102 into the p-type layers 13, wherein those parts exposed at the other main surface 12 are long and narrow with their longitudinal direction oriented in the same direction as the p-type layers; and an annular, peripheral p-type layer 15 extending from the other main surface 102 deeper into the n− layer 12 than the p-type layers 13, surrounding the plurality of p-type layers 13, while being contiguous to some of the p-type layers 13. In the outermost p-type layer 13 in the direction at right angles with the longitudinal direction of the plurality of p-type layers 13, there is a piece of n+ layer 14, while in each of the other p-type layers 13, there are two pieces of n+ layers 14. Reference numeral 2 indicates a first main electrode in ohmic contact with the substrate region 11 at one main surface 101 of the semiconductor substrate 1, and reference numeral 3 indicates a second main electrode in ohmic contact with the n+ layers 14 and the p-type layers 13. This second main electrode 3 is in ohmic contact with a p-type layer 13 by that side of the n+ layer 14 which is closer to the peripheral p-type layer 15 int he outermost p-type layer 13, and also, the second main electrode 3 is in ohmic contact with the exposed parts of the p-type layers 13 between two n+ layers 24. At the opposite ends of the longitudinal direction of the p-type layers 13, the second main electrode 3 extends beyond the n+ layers 14 to the peripheral area and are in ohmic contact with the p-type layers 13. Reference numeral 4 indicates first insulated gate electrodes provided on the other main surface 102 of the semiconductor device 1 with an insulating film 5 interposed and each first insulated gate electrode 4 extends form one n+ layer 14 formed at one side of the adjacent p-type layer 13 to the other n+ layer 14 formed on the other side thereof. Reference number 6 indicates a second insulated gate provided on the other main surface 102 of the semiconductor substrate 1 with an insulating film 7 interposed, and along and above the peripheral p-type layer 15. The first insulated gate electrode 4 and the second insulated gate electrodes 6 are electrically connected. Reference numerals 8 and 9 indicate insulating films formed above the first and second insulated gate electrodes 4, 6. The second main electrode 3 extends on the insulating film 8, and the adjacent second main electrodes are electrically connected to each other.

According to this semiconductor device, those contact parts between the p-type layers 13 and the second main electrode 3 which are in the longitudinal direction of the juxtaposed, long and narrow p-type layers 13 and the other contact part which is at the outermost position in the direction at right angles with the longitudinal direction of those p-type layers 13 are closer to the peripheral p-type layer 15 than the n+ layers 14, and therefore, the holes ⊕ injected into the n− layer 12 adjacent to the peripheral p-type layer 15 and the stored charge of the p-n junction can be extracted and put into the second main electrode 3 smoothly when the device is turned off. Because of this and also because there is no parasitic thyristor or parasitic transistor in the deposited direction of the peripheral p-type layer 15, it is possible to obtain an IGBT or a power MOSFET with high-speed switching capability and high breakdown strength. In addition, by making a peripheral p-type layer 15 of higher impurity concentration than that of the p-type layers 13, the high-speed switching capability and the high breakdown strength can be further improved.

Figure 1D:
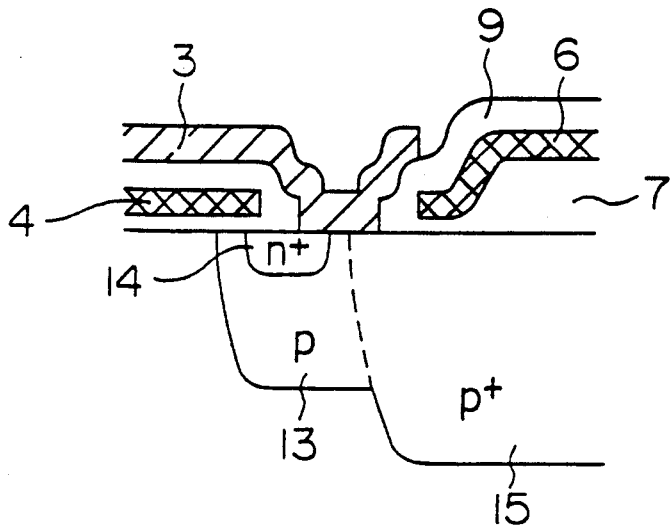
Figure 1E:
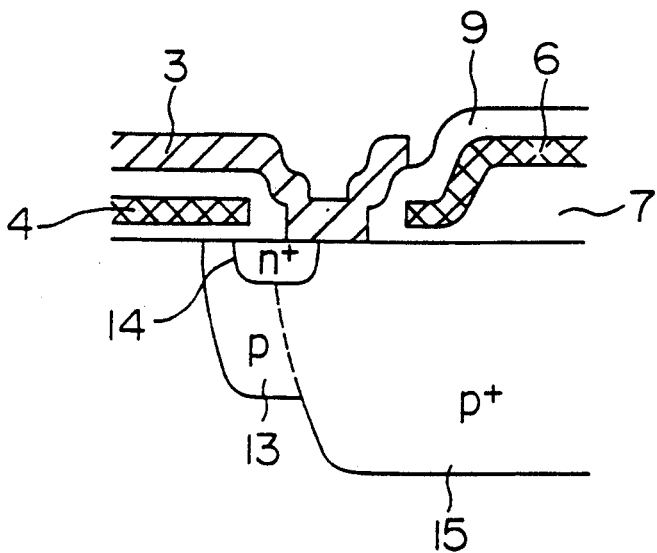

FIGS. 1C to 1E show three kinds of embodiments regarding the construction of the peripheral area of the semiconductor device according to the present invention by which to explain the area including the main electrode 3, the p-type layer 13, and the p+ layer 15 by using their enlarged views. FIG. 1C shows an embodiment in which the main electrode 3 is in contact only with the p-type layer 13. FIG. 1D shows an embodiment in which the main electrode 3 is in contact with the p-type layer 13 and the p+ layer 15. FIG. 1E shows an embodiment in which the main electrode 3 is in contact only with the p+ layer 15. As the contact area between the main electrode 3 and the p+ layer 15 is increased, the effect of the present invention will become more conspicuous, and the high-speed operation and the high insulation strength can be realized. However, it is not desirable to form the p+ layer so as to extend to a region just below the gate electrode 4 because this will increase the threshold voltage of the MOS gate.

Figure 7:
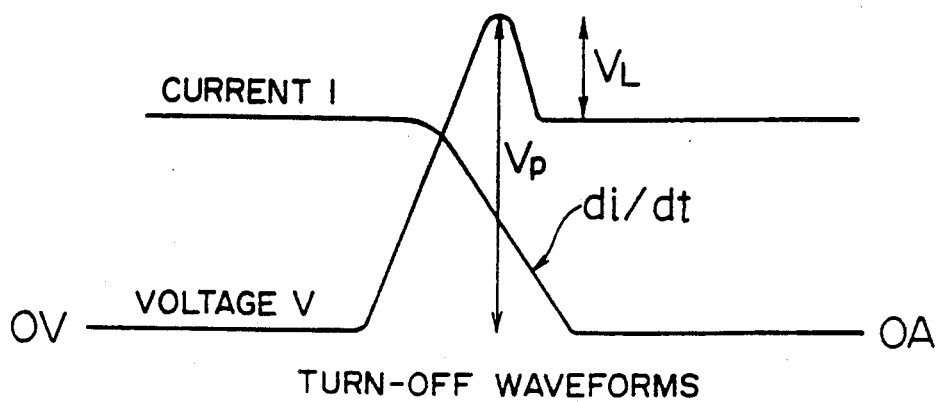
FIG. 7 is a diagram for explaining the turn-off waveforms of the semiconductor device according to the present invention.
Figure 8:
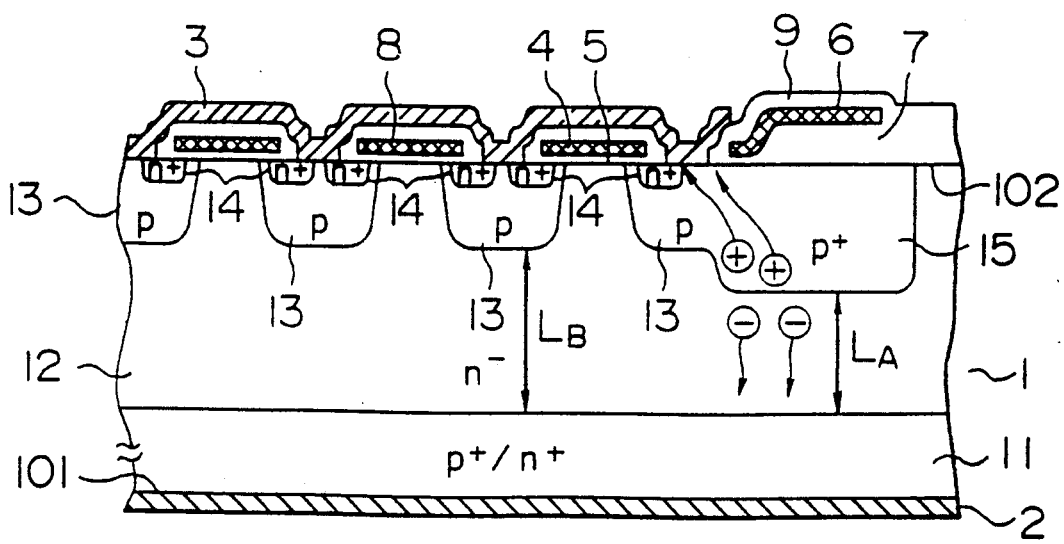
FIG. 8 is a diagram for explaining the transient state of the semiconductor device according to the present invention.

The operation in the transient state of the semiconductor device according to the present invention, shown in FIG. 1, will now be described with reference to FIGS. 7 and 8. Generally, semiconductor devices such as the IGBT or the power MOSFET are most commonly used with an inductive load. When an inductive load is turned off, an over-voltage Vp occurs as shown in FIG. 7. More specifically, when the inductive load is switched from the state that a current I is being supplied to the OFF state, the voltage V rises and the current drops. At this time, $V_L = L \times di/dt$ occurs owing to the change rate di/dt of the current I and the L component of the wire, and an over-voltage Vp develops. This Vp often exceeds the breakdown strength of the device, resulting in the destruction of the device.

A semiconductor device according to the present invention, which is shown in FIG. 1, has a deep p-type layer at the peripheral area and deep p-type layers in the central area. Consequently, as shown in FIG. 8, the n− layer is thin ($L_A$) in the peripheral area, while the n⁻ layer is thick ($L_B$) in the central area. Therefore, when a voltage is applied to the emitter (source) and the collector (drain), the electric field is strong in the peripheral area where the n⁻ layer is thin, providing chances for an avalanche to take place easily. Once an avalanche has occurred, holes ⊕ and electrons are produced in the peripheral area, the holes ⊕ flow to the emitter (source) and the electrons ⊖ to the collector (drain), thus giving rise to a large current. If there is a parasitic thyristor (in an IGBT) or a parasitic transistor (in a power MOSFET) in the flowing path of the holes ⊕, the parasitic device operates, resulting in the device being destroyed. In the present invention, however, there is no n+ layer to form a parasitic device, a fact which provides the semiconductor device with an advantage of having a very high avalanche breakdown strength.

To be more specific, the provision of the deep p+ layer limits the region where an avalanche may occur, the continuation of the p-type layer and the p+ layer limits the path of current when an avalanche occurs, and the parasitic device above the current path has been eliminated. With these features of the device, it is possible to achieve a great avalanche breakdown strength. The present invention provides a substantial effect when the present invention is used for the IGBT because the electrons ⊖ produced by an avalanche causes the holes ⊕ to be injected from the p+ substrate, thus increasing the number of holes ⊕ still further, so that the breakdown strength is more liable to be decreased.

With an IGBT embodying the present invention shown in FIG. 1A, the maximum current value when the device is turned off is about one order of magnitude greater than in prior-art IGBTs. The maximum current in avalanche breakdown has increased about 20 times greater than before.

Figure 2:
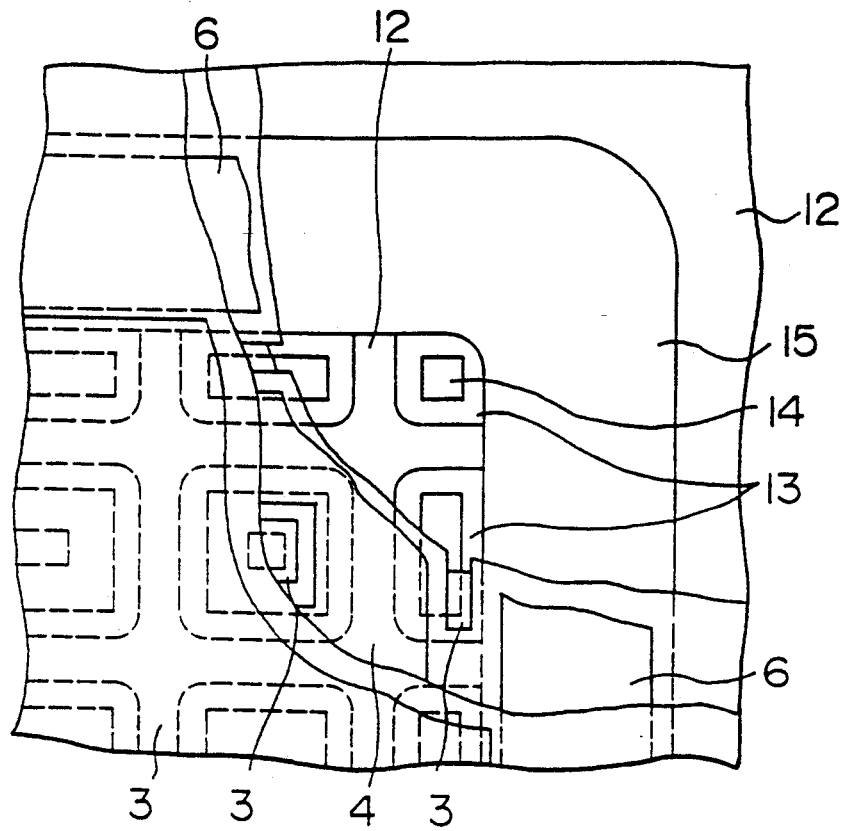
FIG. 2 is a plan view of another embodiment of the present invention.

FIG. 2 shows another embodiment of the present invention. The device structure is almost the same as in the embodiment of FIG. 1, excepting that the p-type layers 13 are rectangular at the other main surface of the device, and accordingly, the n+ layers 14 formed in the p-type layers 13 are rectangular. Also in this embodiment, the n+ layer 14, formed in that outermost one of the juxtaposed p-type layers 13 which is contiguous to the peripheral p-type layer 15, is located farther from the peripheral p-type layer 15 than the contact parts between the second main electrode 3 and the p-type layers 13, so that the same effect as in the embodiment of FIG. 1 can be achieved.

Figure 3:
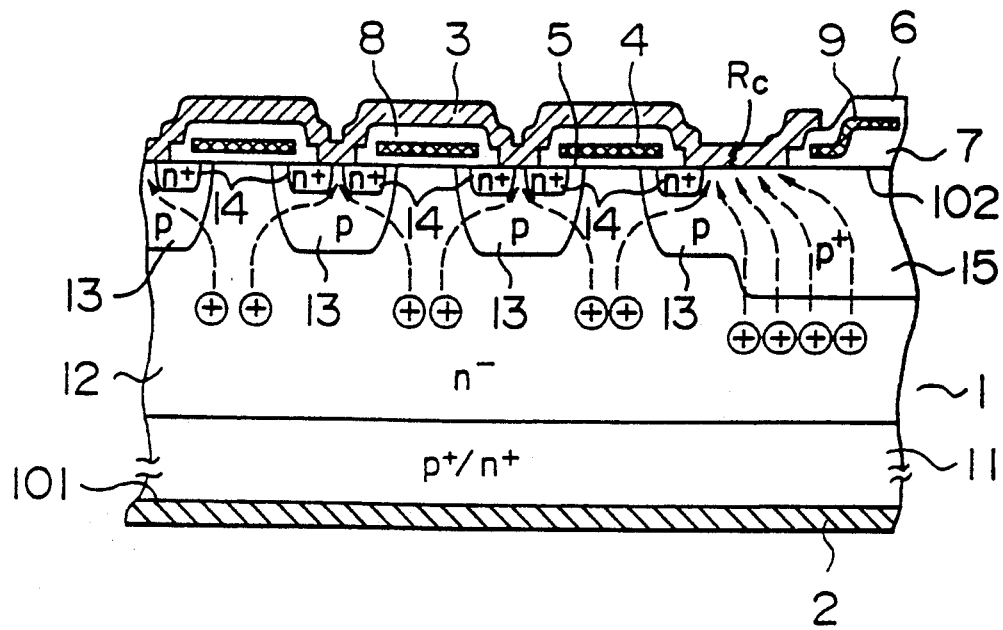
FIG. 3 shows a still another embodiment of the present invention.
Figure 4:
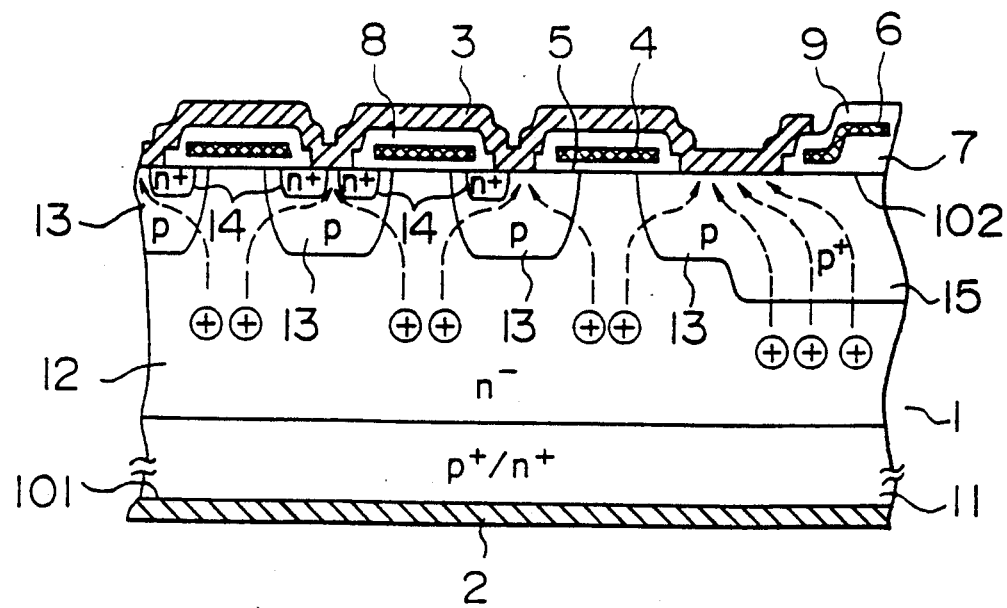
FIG. 4 shows yet another embodiment of the present invention.
Figure 5:
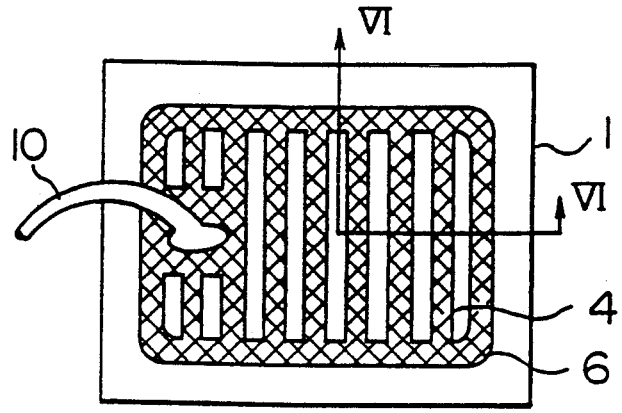
FIG. 5 is a plan view of a semiconductor device.
Figure 6:
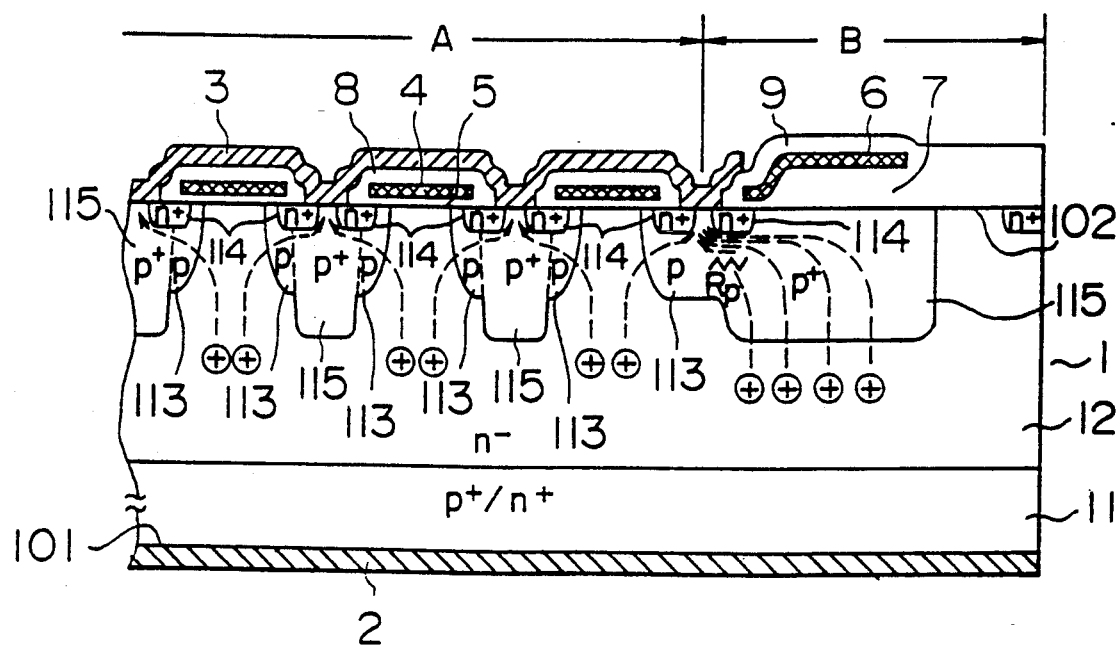
FIG. 6 is a cross-sectional view taken along the line VI—VI of the semiconductor device of FIG. 5.

FIG. 3 is a still another embodiment of the present invention. This embodiment is almost the same as the embodiment of FIG. 1, the only difference being that the contact area between the second main electrode 3, and the p-type layer 13 and the peripheral p-type layer 15 at the outer periphery portion of the outermost n+ layer 14 has been made large. In the embodiment of FIG. 1, the contact areas between the second main electrode 3 and the p-type layers 13 are almost equal across the whole range of the other main surface 102. Therefore, in the embodiment of FIG. 1, the contact resistance Rc between the second main electrode 3 and the p-type layer 13 at the outer periphery portion of the outermost n+ layer 14 is large, so that there is a possibility that a parasitic thyristor or a parasitic transistor operates. In the present embodiment, on the other hand, the contact area between the second main electrode 3, and the p-type layer 13 and the peripheral p-type layer 15 has been made large to reduce the contact resistance Rc, so that the risk involved in the embodiment of FIG. 1 can be eliminated. As the result of various experiments, it has been confirmed that the voltage drop in turning off the device should preferably be 0.1 V or less. In addition, according to this embodiment, since the contact resistance Rc is small, the holes injected into the n⁻ layer 12 and the charge stored when the device is in the ON state can be quickly extracted and put into the second main electrode 3, enabling the device to turn off at higher speed than in the embodiment of FIG. 1. It ought to be noted that the p-type layers 13 and the n+ layers 14 in the embodiment of FIG. 3 can be formed as shown in FIGS. 1B and 2. FIG. 4 shows yet another embodiment of the present invention. This embodiment is almost identical with the embodiment of FIG. 1, excepting that an n+ layer 14 is not formed in the outermost p-type layer contiguous to the peripheral p-type layer 15, but an n+ layer 14 is formed in the p-type layer 13 which is the second inside from the outermost p-type layer 13. Also in this embodiment, the contact parts of the p-type layers 13 with the second main electrode 3 are located so as to be closer to the p-type layer 15 than the n+ layers 14. According to this device structure, an n+ layer 14 is provided away from that contact part between the outermost p-type layer 13 and the peripheral p-type layer 15, and the second main electrode 3 which serves as the path of chiefly the hole current and the flow of the stored charge, and therefore, the effect of the parasitic thyristor or the parasitic transistor can be removed more securely than in the embodiments of FIGS. 1 to 3. The p-type layers 13 and the n+ layers 14 in this embodiment may be formed as shown in FIGS. 1B and 2.

Description has been made of representative embodiments of the present invention. However, the present invention is not limited to those embodiments but can be embodied in various forms.

In U.S. Pat. No. 5,032,532, a method is proposed for forming an n+ layer by forming such a material containing n-type impurities as PSG (phosphosilicate glass) on the side walls of the gate electrode, and then diffusing the element P contained in the PSG into the silicon crystal.

As an example of a manufacturing method of a semiconductor device according to the present invention, description will be made of a method for fabricating a semiconductor device according to the present invention from a material existing on the side walls of the gate electrodes.

Figure 9:
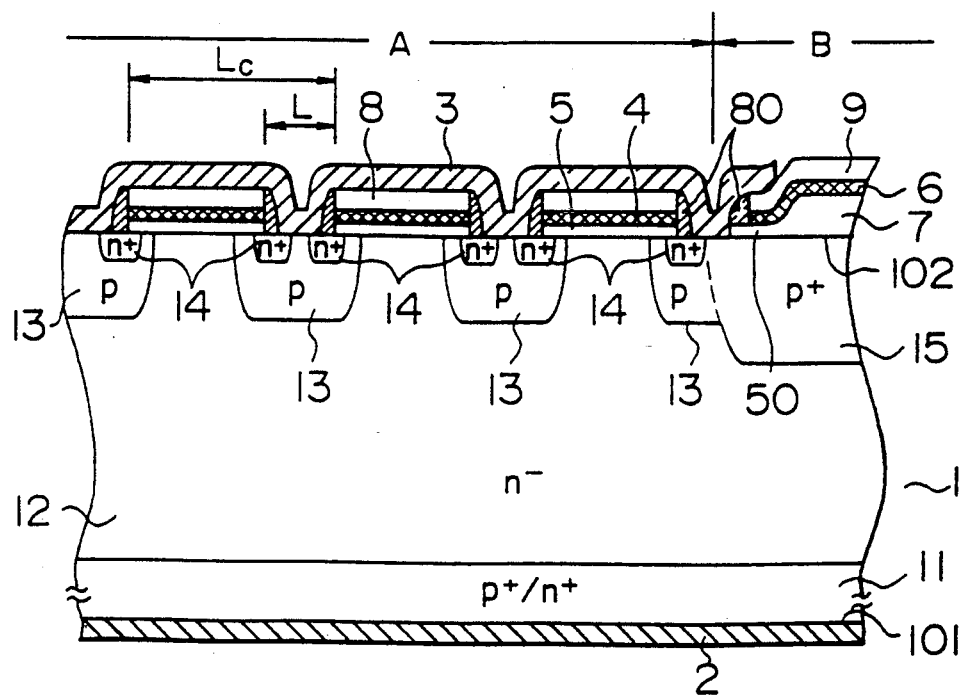
FIG. 9 is a diagram for explaining an additional embodiment of the semiconductor device according to the present invention.

FIG. 9 shows an example of a semiconductor device according to the present invention, manufactured by this method. The semiconductor device according to the present invention has a material 80 containing n-type impurities formed on the side walls of the gate electrodes 4. The material 80 is formed of PSG, for example. Beneath the material 80, n+ layers 14 are formed by diffusion. In the peripheral area Ⓑ of the semiconductor device of FIG. 9, an insulating film 50 is formed between the material 80 containing n-type impurities and the silicon region. Since the insulating film 50 inhibits the diffusion of the n-type impurities, no n+ layer is formed in the peripheral area Ⓑ. Owing to the presence of the insulating film 50, the characteristic structure of the semiconductor device according to the present invention is realized.

An example of a procedure of the manufacturing method of the semiconductor device according to the present invention will be described with reference to FIGS. 10A to 10F.

Figure 10A:
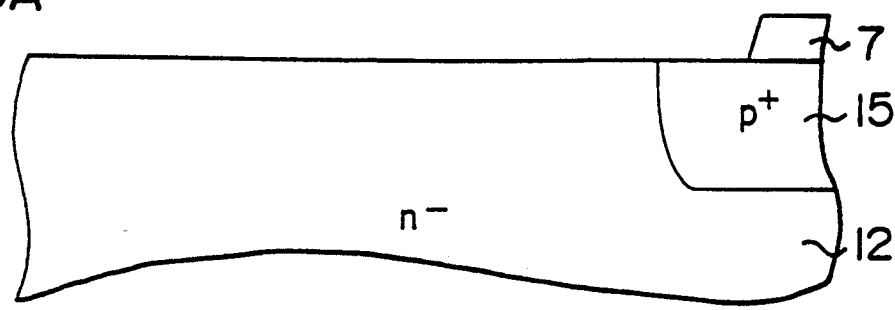
FIGS. 10A to 10F are diagrams for explaining an embodiment of the semiconductor device according to the present invention.

(1) After a p-type layer 15 is first formed by diffusion, an insulating film 7 is formed. (FIG. 10A)

Figure 10B:
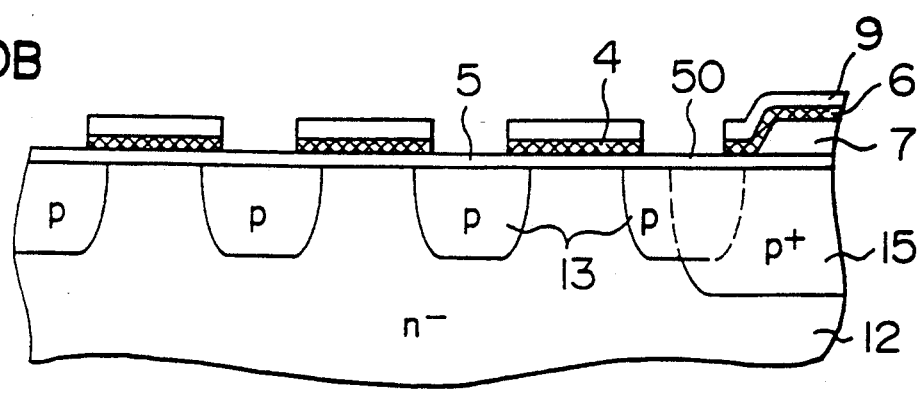

(2) After oxide films 5, 50 are formed, gate electrodes (polycrystalline silicon, for example) 4, 6, and an insulating film (SiO$_2$, for example) are deposited one after another. Then, specified parts of the insulating film 9 and the gate electrodes 4, 6 are removed by anisotropic dry etching, for example. Next, positively charged ions of dopant (boron, for example) are caused to penetrate into the silicon in which the boron ions diffuse to form p-type layers 13. (FIG. 10B)

Figure 10C:
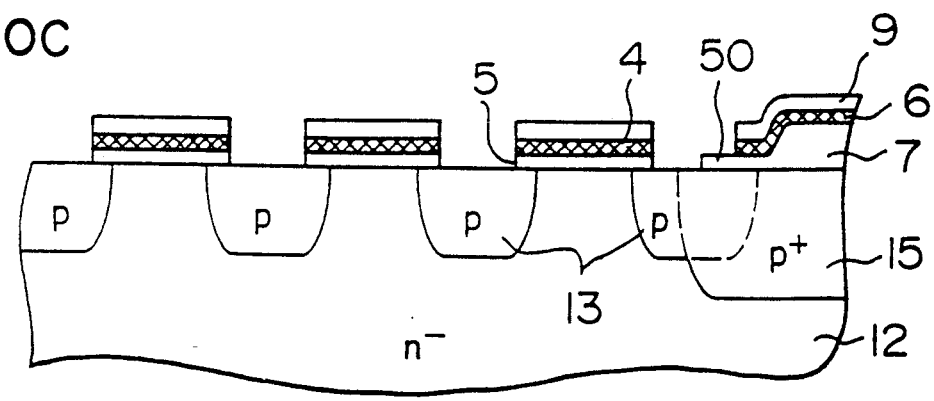

(3) The oxide film 5 existing along the side faces of the gate electrodes 4 is removed. In the peripheral area (B), however, the oxide film 51 is not removed and remains. (FIG. 10C)

Figure 10D:
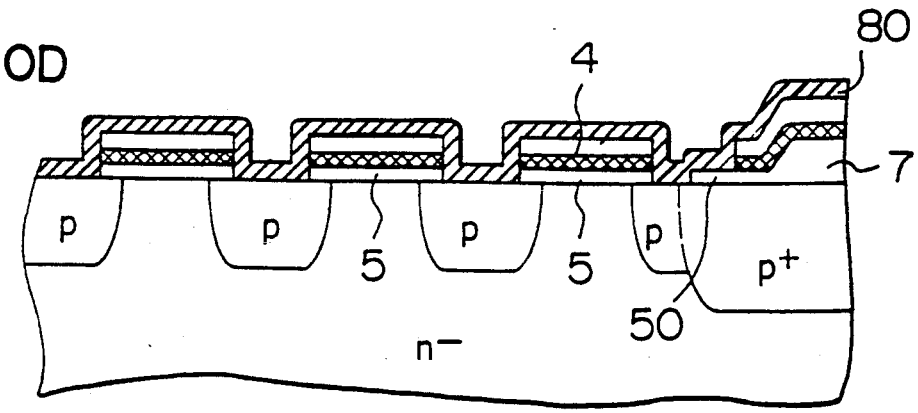

(4) A material containing n-type impurities, PSG 80 for example, is deposited on the whole surface area. (FIG. 10D)

Figure 10E:
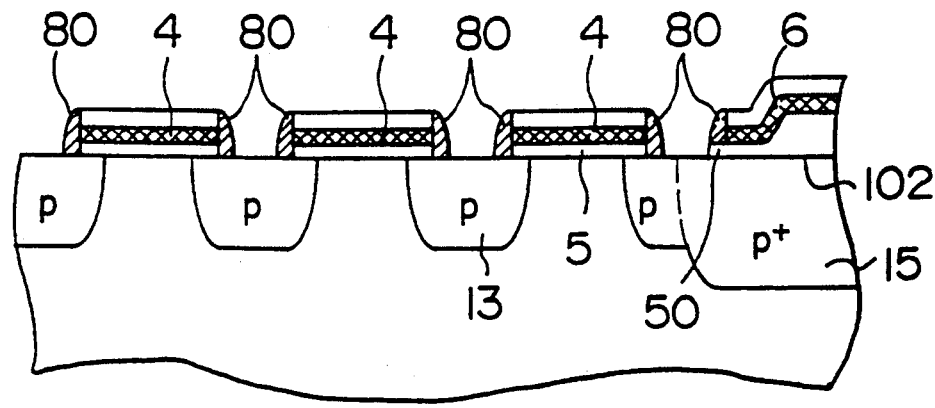

(5) By use of an anisotropic dry etching technique, a side wall 80 of PSG is formed on the side faces of the gate electrodes 4, 6. (FIG. 10E)

Figure 10F:
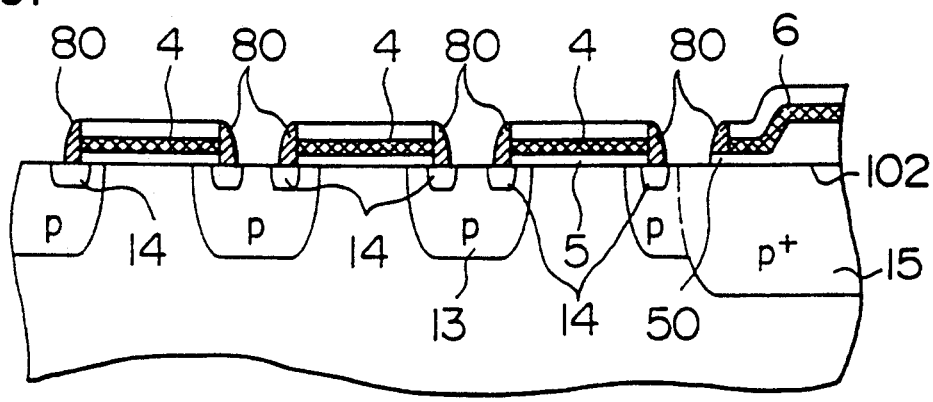

(6) The semiconductor device in process is then subjected to heat treatment whereby the phosphorus in the PSG 80 is diffused into the p-type layers 13 to form n$^+$ layers 14. In the peripheral area (B), the oxide film 50 remaining beneath the PSG film 80 inhibits the phosphorus from being diffused, so that no n$^+$ layers 14 are formed. (FIG. 10F)

(7) A source electrode 3 is deposited. Thus, a semiconductor device of FIG. 9 is manufactured. (FIG. 9)

In the other embodiment, a semiconductor device of FIG. 9 may be fabricated by using an n$^-$ substrate as a starting material. Namely, an n$^+$ region or a p$^+$ region 11 may be formed by diffusion of impurities from one surface of the substrate. P regions 13, 15 and n$^+$ regions 14 may be formed by succeeding diffusions from the other surface of the substrate. Of course, semiconductor device of FIG. 9 may be fabricated by ion injections instead of diffusions.

Lately, the trend has been towards reduction of the dimension Lc (refer to FIG. 9) of a unit cell of the IGBT in order to increase the output current density of the IGBT. To be more specific, Lc is reduced to increase the number of cells integrated per unit area, thereby increasing the output current density. In the semiconductor device of FIG. 9, it is possible to insulate the electrodes 3 and 4 from each other by using the PSG side walls 80. Furthermore, in the semiconductor device of FIG. 9, the p-type layers 13, n$^+$ layers 14, insulators 80, and the electrode contact holes are all formed along the side walls of the gate electrodes 4 with self alignment. Therefore, it is possible to reduce the size of the unit cells of the IGBT by use of the manufacturing method according to the present invention.

In the semiconductor device of FIG. 9 according to the present invention, the turn-off current value has been increased more than 20 times higher and the avalanche current value has been increased more than 50 times higher than in the prior-art semiconductor device.

Figure 11:
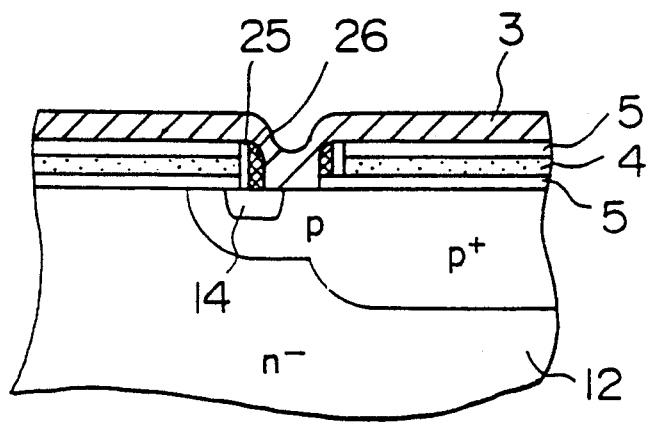
FIG. 11 is a schematic cross section showing an embodiment of the semiconductor device according to the present invention.

FIG. 11 shows a part of an embodiment of the semiconductor device according to the present invention. An insulating film 25 (SiO$_2$, SiN, for example) is provided on the side face of the gate electrode, and on the side face, a material 26 containing impurities of one conductivity is formed. The material 26 may be PSG, which is an insulator, or a conductive polysilicon. This material 26 is insulated securely by the insulator 25. The provision of the conductive material 26 makes it possible to use the material 26 as an outlet electrode of the n$^+$ source layer 14, and also makes it possible to provide a wide contact area between the n$^+$ source layer 14 and the source electrode 3, so that the contact resistance can be reduced.

In the foregoing, the present invention has been described with reference to a case where the n$^-$-p-n$^+$ layer is formed on the substrate, but this invention can be applied also to the formation of a p$^-$-n-p$^+$ layer on the substrate.

We claim:

1. A semiconductor device manufacturing method comprising the steps of:

forming a semiconductor layer of the first conductivity type on a semiconductor substrate;

forming a first semiconductor well region of the second conductivity type having a high impurity concentration in that specified region of said semiconductor layer corresponding to the peripheral area of the semiconductor device;

forming oxide films on the surfaces of said semiconductor layer and said first semiconductor well region;

successively depositing gate electrodes and an insulating layer on said oxide films;

removing said deposited gate electrodes and said deposited insulating film in specified areas to make openings for forming metal contacts;

implanting ionic impurity atoms of the second conductivity type through said oxide films remaining in the openings for metal contacts, thereafter putting the implanted silicon through heat treatment, thus forming a plurality of second semiconductor well regions of the second conductivity type, the wells of which are shallow compared with said first semiconductor well region;

removing said oxide film remaining in said opening for metal contacts excepting a specified part corresponding to the peripheral area of the semiconductor device;

depositing a layer of a material containing impurities of the first conductivity type and etching away unnecessary parts of said layer to form side walls of said layer on the side faces of said gate electrodes; and annealing a silicon chip comprising said substrate to diffuse the impurities of the first conductivity type contained in said layer into said second semiconductor well regions excepting the region where the diffusion of said first conductivity type impurities is inhibited by the remaining oxide film, thus forming a plurality of third semiconductor well regions of the first conductivity type.

* * * * *